US008543891B2

(12) United States Patent
Anholt et al.

(10) Patent No.: US 8,543,891 B2
(45) Date of Patent: Sep. 24, 2013

(54) POWER-OPTIMIZED DECODING OF LINEAR CODES

(75) Inventors: Micha Anholt, Tel Aviv (IL); Naftali Sommer, Rishon Le-Zion (IL)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/547,288

(22) Filed: Jul. 12, 2012

(65) Prior Publication Data

US 2013/0073928 A1  Mar. 21, 2013

Related U.S. Application Data

(60) Provisional application No. 61/537,144, filed on Sep. 21, 2011.

(51) Int. Cl.
*H03M 13/00* (2006.01)
(52) U.S. Cl.
USPC ........... 714/758; 714/781; 714/752; 714/746; 714/699

(58) Field of Classification Search
None
See application file for complete search history.

(56) References Cited

U.S. PATENT DOCUMENTS

| | | | |
|---|---|---|---|
| 2004/0151259 A1 | 8/2004 | Berens et al. | |
| 2005/0138519 A1 | 6/2005 | Boutillon et al. | |
| 2006/0098731 A1* | 5/2006 | Bae | 375/240.1 |
| 2007/0283227 A1* | 12/2007 | Sharon et al. | 714/776 |
| 2009/0089648 A1* | 4/2009 | Tsui et al. | 714/795 |
| 2009/0182918 A1* | 7/2009 | Hollis | 710/106 |
| 2010/0026533 A1* | 2/2010 | Hollis | 341/58 |
| 2010/0199149 A1* | 8/2010 | Weingarten et al. | 714/773 |
| 2010/0214138 A1* | 8/2010 | Hollis | 341/55 |
| 2011/0087933 A1 | 4/2011 | Varnica et al. | |
| 2011/0252283 A1* | 10/2011 | Mokhlesi et al. | 714/719 |
| 2012/0005551 A1* | 1/2012 | Gunnam | 714/752 |
| 2012/0198301 A1* | 8/2012 | Blanksby | 714/752 |
| 2012/0266042 A1* | 10/2012 | Shen et al. | 714/755 |

FOREIGN PATENT DOCUMENTS

| | | |
|---|---|---|
| EP | 2 256 974 A2 | 12/2010 |
| WO | 2008/039098 A1 | 4/2008 |

OTHER PUBLICATIONS

Chih-Hung Lin; Huang, A.C.-L.; Chang, R.C.-H.; Kuang-Hao Lin; , "Low-power design of variable block-size LDPC decoder using nanometer technology," Circuits and Systems (ISCAS), Proceedings of 2010 IEEE International Symposium on , vol., No., pp. 1759-1762, May 30, 2010-Jun. 2, 2010.*

Min Hyuk Kim; Tae Doo Park; Chul Seong Kim; Ji Won Jung; , "An FPGA design of low power LDPC decoder for high-speed wireless LAN," Communication Technology (ICCT), 2010 12th IEEE International Conference on , vol., No., pp. 1460-1463, Nov. 11-14, 2010.*

(Continued)

*Primary Examiner* — Steve Nguyen
*Assistant Examiner* — Shen Wang
(74) *Attorney, Agent, or Firm* — Meyertons, Hood, Kivlin, Kowert & Goetzel PC

(57) ABSTRACT

A method includes accepting an input code word, which was produced by encoding data with an Error Correction Code (ECC), for decoding by a hardware-implemented ECC decoder. The input code word is pre-processed to produce a pre-processed code word, such that a first number of bit transitions that occur in the hardware-implemented ECC decoder while decoding the pre-processed code word is smaller than a second number of the bit transitions that would occur in the ECC decoder in decoding the input code word. The pre-processed code word is decoded using the ECC decoder, and the data is recovered from the decoded pre-processed code word.

24 Claims, 2 Drawing Sheets

(56) References Cited

OTHER PUBLICATIONS

Ghoneima, M.; Ismail, Y.; Khellah, M.M.; Tschanz, J.; De, V., "Serial-Link Bus: A Low-Power On-Chip Bus Architecture," Circuits and Systems I: Regular Papers, IEEE Transactions on, vol. 56, No. 9, pp. 2020,2032, Sep. 2009.*

Winkler "Advances in Syndrome Coding based on Stochastic and Deterministic Matrices for Steganography". Ph.D Dissertation, Technical University Dresden [online]. Published Nov. 1, 2011. Retrived from www.qucosa.de/fileadmin/data/qucosa/documents/8414/arbeit.pdf pp. 1-64.

International Search Report and Written Opinion in application No. PCT/US 12/56486 mailed Nov. 26, 2012.

Extended Search Report in EP Application No. 12185166.1-2218, issued Jan. 16, 2013, pp. 1-11.

Gilbert et al.; "Low Power Implementation of a Turbo-Decoder on Programmable Architectures;" Proc. of the Asia and South Pacific Design Automation Conference, Jan. 30-Feb. 2, 2001, Yokohama, Japan; pp. 400-403.

Darabiha et al.; "Power Reduction Techniques for LDPC Decoders;" IEEE Journal of Solid-State Circuits, vol. 43, No. 8, Aug. 2008; pp. 1835-1845.

* cited by examiner

POWER-OPTIMIZED DECODING OF LINEAR CODES

CROSS-REFERENCE TO RELATED APPLICATIONS

This application claims the benefit of U.S. Provisional Patent Application 61/537,144, filed Sep. 21, 2011, whose disclosure is incorporated herein by reference.

FIELD OF THE INVENTION

The present invention relates generally to error correction, and particularly to methods and systems for reducing power consumption of Error Correction Code (ECC) decoders.

BACKGROUND OF THE INVENTION

Error Correction Codes (ECC) are used in a variety of systems and applications for protecting data from errors. Many popular ECC schemes use linear codes, such as Hamming, Reed-Solomon, Bose-Chaudhuri-Hocquenghem (BCH), Low Density Parity Check (LDPC) and Turbo codes. Some ECC decoding schemes use hard decoding, whereas other decoding schemes operate on soft decoding metrics such as Log Likelihood Ratios (LLRs).

SUMMARY OF THE INVENTION

An embodiment of the present invention that is described herein provides a method including accepting an input code word, which was produced by encoding data with an Error Correction Code (ECC), for decoding by a hardware-implemented ECC decoder. The input code word is pre-processed to produce a pre-processed code word, such that a first number of bit transitions that occur in the hardware-implemented ECC decoder while decoding the pre-processed code word is smaller than a second number of the bit transitions that would occur in the ECC decoder in decoding the input code word. The pre-processed code word is decoded using the ECC decoder, and the data is recovered from the decoded pre-processed code word.

In some embodiments, pre-processing the input code word includes replacing the input code word with an all-zeros code word, and decoding the pre-processed code word includes causing the ECC decoder to converge to an error pattern in the input code word. Replacing the input code word with the all-zeros code word typically includes retaining reliability values of respective bits of the input code word, and providing the all-zeros code word and the reliability values to the ECC decoder.

In an embodiment, the ECC is defined by a set of check equations, the ECC decoder includes check nodes that correspond respectively to the check equations and exchange messages with bit nodes that correspond to respective bits of the pre-processed code word, and causing the ECC decoder to converge to the error pattern includes configuring each check node to generate first messages that increase a reliability or retain a sign of bits participating in a respective check equation if an evaluation of the check equation equals a respective syndrome, and to generate second messages that reduce the reliability or invert the sign of the bits participating in the respective check equation if the evaluation of the check equation differs from the respective syndrome.

In some embodiments, recovering the data includes calculating a bit-wise XOR between the decoded pre-processed code word and a hard bit estimate of the input code word. In an embodiment, the input code word includes a data part and a redundancy part, pre-processing the input code word includes encoding the data part with the ECC to produce an encoding result, and recovering the data includes calculating a bit-wise XOR between the encoding result and the decoded pre-processed code word.

In a disclosed embodiment, accepting the input code word includes accepting multiple soft decoding metrics corresponding to respective bits of the input code word, pre-processing the input code word includes pre-processing the soft decoding metrics, and decoding the pre-processed code word includes applying a soft decoding process to the pre-processed soft decoding metrics. Pre-processing the input code word may include representing the soft decoding metrics using a sign-magnitude format.

In an embodiment, the method includes accepting, in addition to the input code word, Cyclic Redundancy Check (CRC) bits that are computed for the input code word, and validating the recovered data using the CRC bits. In an example embodiment, recovering the data includes calculating a bit-wise XOR between the decoded pre-processed code word and a fixed data pattern, and validating the data includes computing, over the fixed data pattern, a first syndrome of a linear code used for producing the CRC bits; computing a second syndrome of the linear code over the recovered data; and comparing the second syndrome to the first syndrome.

In an embodiment, recovering the data includes calculating a bit-wise XOR between the decoded pre-processed code word and a fixed data pattern, and validating the data includes modifying the fixed data pattern such that applying the CRC over the recovered data will be zero when the data is decoded correctly.

In some embodiments, accepting the input code word includes receiving the input code word over a communication channel. In alternative embodiments, accepting the input code word includes reading the input code word from a memory.

There is additionally provided, in accordance with an embodiment of the present invention, apparatus including a hardware-implemented Error Correction Code (ECC) decoder and ancillary circuitry. The hardware-implemented ECC decoder is configured to decode ECC code words. The ancillary circuitry is configured to accept an input code word, which was produced by encoding data with the ECC, to pre-process the input code word to produce a pre-processed code word, such that a first number of bit transitions that occur in the hardware-implemented ECC decoder while decoding the pre-processed code word is smaller than a second number of the bit transitions that would occur in the ECC decoder in decoding the input code word, to decode the pre-processed code word using the ECC decoder, and to recover the data from the decoded pre-processed code word.

The present invention will be more fully understood from the following detailed description of the embodiments thereof, taken together with the drawings in which:

DETAILED DESCRIPTION OF EMBODIMENTS

Overview

Figure 1:
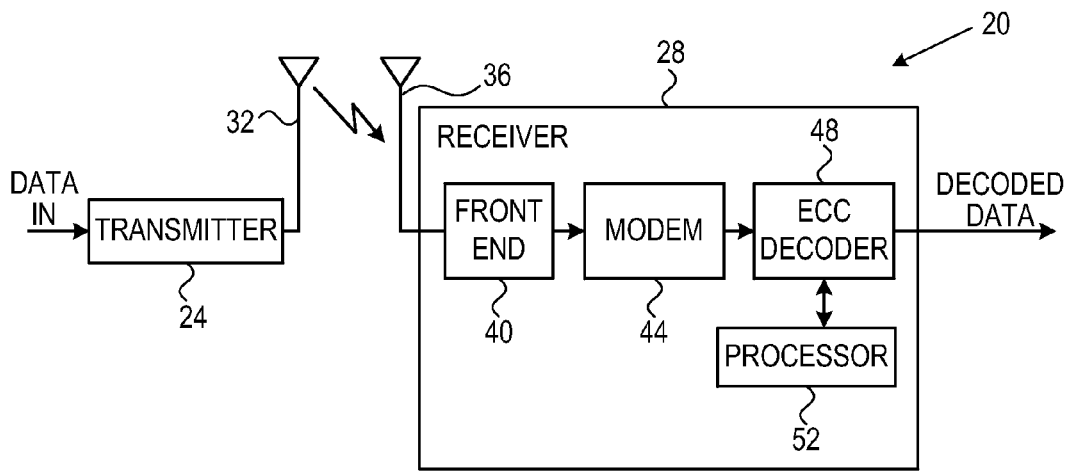
FIG. 1 is a block diagram that schematically illustrates a communication system that employs Error Correction Coding (ECC), in accordance with an embodiment of the present invention.

Minimizing power consumption is a prime consideration in many applications involving ECC decoding. When an ECC decoder is implemented in hardware, the decoder power consumption varies considerably with the number of bit transitions that occur in the hardware during the decoding process. A large number of bit transitions between "0" and "1", for example in data readout from memory or in arithmetic or logical computations, will typically increase the power consumption, and vice versa.

Embodiments of the present invention that are described herein provide improved ECC decoders and associated methods. The disclosed techniques reduce the number of bit transitions that occur in the decoder hardware during the decoding process, and therefore reduce the decoder power consumption.

In some embodiments, an input code word is pre-processed by ancillary circuitry before being decoded by a hardware-implemented ECC decoder. The pre-processing scheme reduces the number of bit transitions that occur in the decoder when decoding the pre-processed code word instead of the original input code word. Several example pre-processing schemes are described herein.

Typically, the ECC decoder carries out a soft decoding process that operates on soft decoding metrics (e.g., Log Likelihood Ratios—LLRs) computed for the respective bits of the input code word. In these embodiments, the input code word is provided to the ancillary circuitry as a sequence of soft decoding metrics. Alternatively, however, the disclosed techniques can also be used with hard ECC decoders, in which case the input code word is provided to the ancillary circuitry as a sequence of hard bits. Typically although not necessarily, the ECC is systematic, in which case the input code word comprises a data part comprises data bits and a redundancy part comprising redundancy bits.

In some embodiments, the problem of decoding the input code word is transformed into an equivalent problem in which the bit values of the input code word are all logical "0"s, but the reliabilities of the bits remain unchanged relative to the original input code word. The decoder is configured to converge to the error pattern instead of to the data bits. After the decoding process is complete, the ancillary circuitry calculates a bit-wise XOR between the decoder output and the respective hard bit estimates of the input code word, to produce a decoding result of the input code word.

In alternative embodiments, the ancillary circuitry encodes the data part of the input code word, and calculates a bit-wise XOR between the result and the input code word. The XOR result is provided to the decoder. After decoding is complete, the ancillary circuitry calculates a bit-wise XOR between the decoder output and the encoded data part of the input code word.

In other embodiments, the ancillary circuitry represents the soft decoding metrics (e.g., LLRs) using sign-magnitude format instead of using two's-complement format. The decoder is also configured to operate on soft metrics that are represented using the sign-magnitude format.

The disclosed techniques are able to achieve considerable reduction in the average power consumption of the ECC decoder, often on the order of 15-20%. This power saving is important, for example, for extending battery life in battery-powered equipment, as well as for reducing cost and heat and increasing reliability.

System Description

FIG. 1 is a block diagram that schematically illustrates a wireless communication system 20 that employs Error Correction Coding (ECC), in accordance with an embodiment of the present invention. System 20 comprises a transmitter 24, which transmits data to a receiver 28. The transmitter accepts input data, encodes the data with an ECC, modulates the encoded data in accordance with a certain modulation scheme, converts the modulated digital signal to an analog signal, up-converts the analog signal to a suitable Radio frequency (RF), and transmits the RF signal toward the receiver using a transmit antenna 32.

In receiver 28, a receive antenna 36 receives the RF signal and provides it to a RF front end 40. The front end down-converts the RF signal to baseband or to a suitable Intermediate Frequency (IF), and digitizes the signal with a suitable Analog to Digital Converter (ADC—not shown in the figure). The digitized signal carrying the ECC-encoded data is demodulated by a modem 44, and the ECC is decoded by an ECC decoder 48. Decoder 48 carries out a power-efficient ECC decoding scheme that is described herein. By decoding the ECC, decoder 48 reconstructs the data that was input to transmitter 24. The reconstructed data is provided as the receiver output. A processor 52 manages the operation of receiver 28.

System 20 may comprise, for example, a cellular system, a satellite system, a point-to-point communication link, or any other suitable communication system that employs ECC. Although the example of FIG. 1 refers to a wireless communication system, the techniques described herein can be used with wire-line communication systems, such as cable communication systems, as well.

Figure 2:
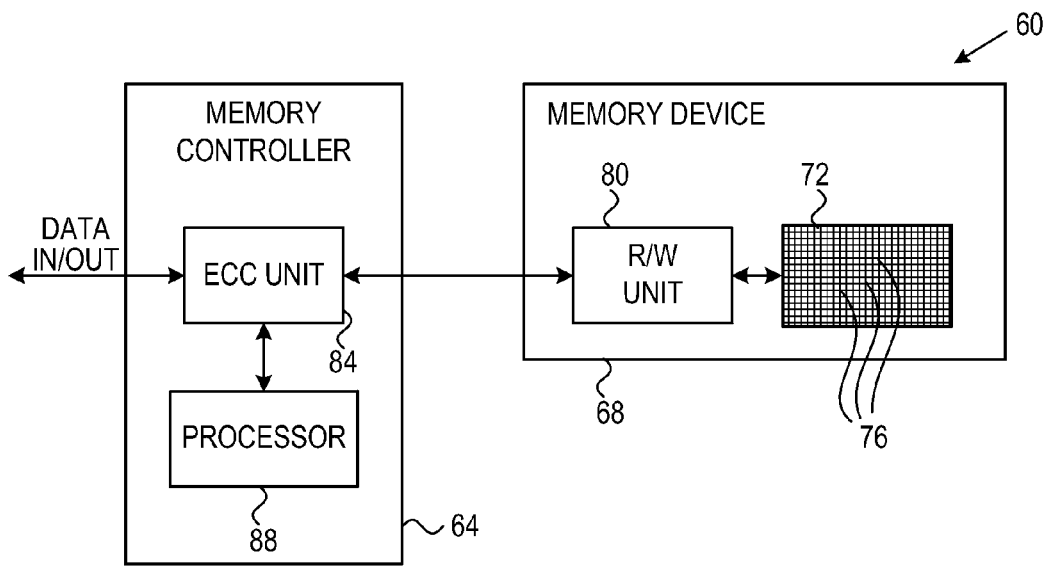
FIG. 2 is a block diagram that schematically illustrates a data storage system that employs ECC, in accordance with an embodiment of the present invention.

FIG. 2 is a block diagram that schematically illustrates a data storage system 60 that employs ECC, in accordance with an alternative embodiment of the present invention. System 60 comprises a memory controller 64, which stores data in a memory device 68. The memory device comprises an array 72 comprising multiple memory cells 76. Array 72 may comprise any suitable type of volatile or non-volatile memory, such as, for example, Random Access Memory (RAM) or Flash memory. Alternatively, device 68 may comprise a magnetic storage device such as a Hard Disk Drive (HDD), or any other suitable storage medium. System 60 can be used in various host systems and devices, such as in computing devices, cellular phones or other communication terminals, removable memory modules ("Flash drive" devices), Solid State Drives (SSD), digital cameras, music and other media players and/or any other system or device in which data is stored and retrieved.

Memory device 68 comprises a Read/Write (R/W) unit 80, which writes data values into memory cells 76 and reads data values from the memory cells. Memory controller 64 comprises an ECC unit 84, which encodes the data for storage with a certain ECC, and decodes the ECC of data that is retrieved from the memory cells. ECC unit 84 carries out a power-efficient ECC decoding scheme that is described herein. A processor 88 manages the operation of memory controller 64.

ECC decoder 48 and ECC unit 84 can be implemented in software, in hardware or using a combination of hardware and software elements. In some embodiments, ECC decoder and ECC unit 84 may be implemented using general-purpose processors, which are programmed in software to carry out the functions described herein. The software may be downloaded to the processors in electronic form, over a network, for example, or it may, alternatively or additionally, be provided and/or stored on tangible media, such as magnetic, optical, or electronic memory.

The ECC decoding schemes described herein can be used in communication systems such as system 20, as well as in data storage systems such as system 60. The description that follows applies to both communication applications and to storage applications, as well as to various other applications that involve ECC, and refers generally to an ECC decoder. Any reference to the ECC decoder applies to decoder 48 of system 20, as well as to the decoder functionality of unit 84 in system 60. Alternatively, the methods described herein can be carried out by any suitable element in any suitable system that involves ECC decoding.

Power-Efficient ECC Decoding

When the ECC decoder is implemented in digital hardware, the decoder power consumption increases considerably with the number of bit transitions that occur during the decoding process. Bit transitions (between logical "0" and "1") that contribute to the power consumption may occur, for example, in hardware components such as registers, latches, multiplexers, memory cells, flip-flops or any other suitable component. In CMOS digital logic, for example, the basic transistor consumes power mainly during state transitions and almost no power when its state is static, and therefore the number of bit transitions has a direct impact on power consumption. It is thus highly desirable to reduce the number of bit transitions that occur in the decoder hardware during decoding.

Embodiments of the present invention that are described below provide improved ECC decoders and associated methods, which reduce the number of bit transitions, and thus the decoder power consumption.

The embodiments described herein refer mainly to decoding of Low Density Parity Check (LDPC) codes. The disclosed techniques, however, can be used in a similar manner for decoding any other suitable type of ECC, such as Hamming, Reed-Solomon, Bose-Chaudhuri-Hocquenghem (BCH) or Turbo code.

The embodiments described herein refer mainly to soft ECC decoders that operate on soft decoding metrics such as Log Likelihood Ratios (LLRs). One example of a soft decoder is a Sum-Product LDPC decoder. The disclosed techniques, however, can be used with any other suitable type of soft decoding metrics, as well as with hard ECC decoders.

The embodiments described herein address mainly systematic codes, in which each code word is divided into a data part that comprises the original data bits, and a redundancy part that comprises redundancy bits computed over the data bits. The disclosed techniques, however, can also be used with non-systematic codes.

The embodiments described herein refer mainly to binary codes in which the encoding and decoding processes are applied to binary bits. The disclosed techniques, however, can also be used with non-binary codes in which encoding and decoding are applied to multi-bit symbols, as well as with codes that are defined over continuous values such as lattice codes.

Figure 3:
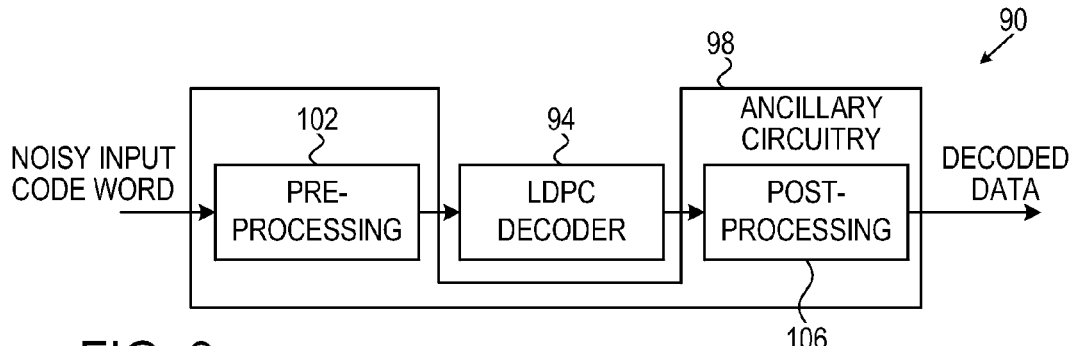
FIG. 3 is a block diagram that schematically illustrates an ECC decoder, in accordance with an embodiment of the present invention.

FIG. 3 is a block diagram that schematically illustrates a power-optimized decoder 90, in accordance with an embodiment of the present invention. Decoder 90 can be used, for example, to implement ECC decoder 48 of FIG. 1 or ECC unit 84 of FIG. 2.

Decoder 90 comprises a hardware-implemented LDPC decoder 94 that is configured to decode LDPC code words, and ancillary circuitry 98 that is configured to process the input and/or output of LDPC decoder 94 so as to reduce the number of bit transitions that occur in decoder 94. LDPC decoder 94 is implemented at least partially in hardware, for example using one or more Field Programmable Gate Arrays (FPGA) or Application-Specific Integrated Circuits (ASIC).

In the present example, ancillary circuitry 98 comprises a pre-processing unit 102. Unit 102 accepts a noisy input code word, which was produced by encoding data with LDPC and sending the encoded data over a noisy channel (e.g., storage or communication channel). Unit 102 applies a certain pre-processing operation to the noisy code word, and the pre-processed noisy code word is provided to LDPC decoder 94 for decoding.

The pre-processing operation is defined such that the number of bit transitions in LDPC decoder 94 in decoding the pre-processed code word is reduced, relative to decoding the original noisy input code word. Several examples of pre-processing operations are described further below. By reducing the number of bit transitions, the average power consumption of LDPC decoder 94 can be reduced by approximately 15-20%.

In some embodiments, ancillary circuitry 98 comprises a post-processing unit 106, which applies a certain post-processing operation to the output of LDPC decoder 94 (i.e., to the decoded pre-processed code word). The post-processing operation reconstructs the data that was originally encoded in the noisy input code word. Several examples of post-processing operations, corresponding to the pre-processing operations, are described further below.

In some implementations of LDPC decoder 94, the LDPC decoder comprises a hardware-implemented digital data path, which processes a sequence of LLRs in a sequential manner. Some of the disclosed techniques assume that a transition between LLRs having the same sign consumes less power than a transition between LLRs having opposite signs. First of all, the sign bit of the LLR will not flip when the LLRs have the same sign (which is sufficient for a hard decoder, for example).

Moreover, for most of the data bits, the LLR magnitude can be assumed to be similar at the same stage of the decoding process. Thus, when the data is represented in two's-complement format, many bits will flip when two LLRs having opposite signs pass through the data path. For example, assume that each LLR is represented using four bits in two's-complement format. Consider two LLRs with values +4 and −5, which are represented by "0100" and "1011", respectively. It can be seen that transitioning between the two LLRs flips all four LLR bits. If, however, the second LLR would be +5 (represented by "0101") instead of −5, only one bit would flip in the transition between the LLRs.

Syndrome Decoding

In some embodiments, ancillary circuitry 98 transforms the problem of decoding a given input code word into an equivalent problem in which the bit values of the input code word are all logical zeros (but the bit reliability values in the soft decoding metrics are unchanged relative to the original input code word). In these embodiments, pre-processing unit 102 replaces the given (noisy) input code word with an all-zeros code word that is provided to LDPC decoder 94.

In this equivalent problem, LDPC decoder 94 is configured to converge to the error pattern of the code word rather than to the data bits. When the decoding process is completed, post-processing unit 106 calculates a bit-wise XOR between the output of LDPC decoder 94 and a hard estimate of the given input code word.

When using this technique with a soft LDPC decoding process, the LLRs of the input code word all begin with the same sign. After convergence of the LDPC decoder, most of the LLRs will still have the same sign (with the exception of the erred bits, which are assumed to be only a small fraction of the overall number of bits in the code word). Consequently, the number of bit transitions in LDPC decoder 94 will be small, and its power consumption will be reduced.

Let each bit in the LDPC decoder input be represented by a hard bit value $h_i$ and a reliability measure $p_i$. When using LLRs, for example, the hard bit values correspond to the signs of the respective LLRs, and the reliability measures correspond to the respective magnitudes of the LLRs. Denote the parity check matrix of the linear code (in the present example the LDPC code) by H. A vector c is a valid code word if and only if Hc=0.

In an iterative LDPC decoder, the decoding process modifies the hard bit values $h_i$ and the reliability measures $p_i$ such that, after convergence, the estimated hard bits $\hat{h}_i$, and estimated reliability measures $\hat{p}_i$ satisfy H$\hat{h}$=0 (wherein $\hat{h}$ denotes a vector of all $\hat{h}_i$, values) and the encoded and modulated decoded code word is closest to the decoder input according to some distance measure.

The disclosed technique can be summarized formally using the following sequence of steps:

Calculate the syndrome s=Hh, wherein h denotes the vector of all $h_i$ values, using the input values for $h_i$.

Configure the LDPC decoder to converge to a pattern $\bar{h}$, which satisfies H$\bar{h}$=s (instead of H$\hat{h}$=0). Carry out the iterative decoding process on an initial input in which all the hard bit values are logical zeros ("0") and the reliability measures are set to $p_i$.

After convergence (to the error pattern), produce the final output $\hat{h}$ by calculating a bit-wise XOR between $\bar{h}$ and h.

It can be shown that the decoding process above is equivalent to the original decoding process in terms of decoding performance, and therefore that the power-efficient scheme described above does not degrade the decoding performance of the LDPC decoder. The original decoding process searches all sequences $\hat{h}$ that satisfy H$\hat{h}$=0, and chooses the sequence that best matches the input bits and probabilities in accordance with some distance measure. The disclosed decoding process searches all sequences $\bar{h}$ that satisfy H$\bar{h}$=s (wherein s=Hh as defined above).

In can be seen that the latter search checks all the code words that are checked in the original search, up to a bit-wise XOR with a constant bit pattern. For example, this will be the situation when the data is randomized by XOR with a fixed pseudo-random sequence. It can thus be shown that the decoder will converge to the same sequence. It can also be shown that the disclosed decoder is equivalent to the original decoder for other decoding processes, such as for Belief Propagation (BP) or sum-product processes.

The LDPC decoder can be configured to converge to the error pattern in any suitable way. Consider an LDPC code that is defined by a set of check equations. A conventional LDPC decoder typically modifies the bit reliabilities in each iteration in a direction that increases the likelihood of the parity check equations being satisfied. In Belief Propagation (BP) decoding, for example, decoding involves iterative message passing between bit nodes and check nodes, wherein each bit node is associated with a respective code word bit and each check node is associated with a respective check equation, and a check equation forces the XOR of its member bits to logical "0".

In a conventional decoder, a check node corresponding to an unsatisfied equation generates messages that tend to reduce the reliability (e.g., the absolute value of the LLR) or to invert the bit value (e.g., LLR sign) of its member bits. A check node corresponding to a satisfied equation generates messages that tend to increase the reliability or retain the same bit value of its member bits.

When the LDPC decoder is to converge to the error pattern, the XOR result of each check equation should equal the corresponding syndrome bit and not a constant "0". Therefore, a satisfied check equation is not defined as an equation for which the XOR of the member bits equals "0", but as an equation whose XOR result equals the corresponding syndrome bit.

Thus, in some embodiments, a check node whose parity check XOR result does not equal the corresponding syndrome bit generates messages that tend to reduce the reliability (or the absolute value of the LLR) or invert the bit value (or LLR sign) of its member bits, and vice versa. This feature can be implemented in a conventional iterative LDPC decoder, for example, by changing the definition of a satisfied equation in the message generating logic as defined above.

Alternatively, a "virtual bit" can be added to each check equation. The value of the virtual bit is the corresponding syndrome bit value and its reliability is set to some large value. With this setting, the conventional definition of a satisfied equation can be used.

Figure 4:
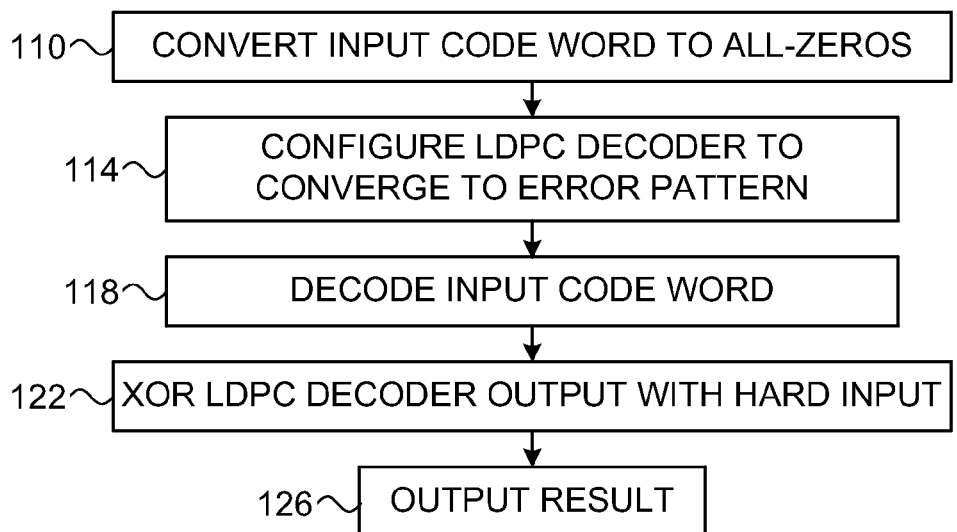
FIGS. 4-6 are flow charts that schematically illustrate methods for power-optimized ECC decoding, in accordance with embodiments of the present invention.

FIG. 4 is a flow chart that schematically illustrates a method for power-optimized ECC decoding, in accordance with an embodiment of the present invention. The method begins with pre-processing unit 102 replacing the input code word with an all-"0" code word and providing the all-"0" code word as input to LDPC decoder 94, at an input step 110. The LLR magnitudes $p_i$ are unchanged.

Unit 102 configures LDPC decoder 94 to converge to the error pattern $\bar{h}$, at a decoder configuration step 114. LDPC decoder 94 decodes the all-"0" code word, coupled with the probabilities $p_i$, so as to converge to $\bar{h}$, at a decoding step 118. After the LDPC decoding of step 118 is complete, post-processing unit 106 calculates a bit-wise XOR between the output of decoder 94 ($\bar{h}$) and the hard bit estimates (h), at a post-processing step 122. Ancillary circuitry 98 provides the XOR result as output, at an output step 126.

Pre-Processing by Encoding the Data Part of the Noisy Input Code Word

In alternative embodiments, pre-processing unit 102 of ancillary circuitry 98 encodes the data part of the (noisy) input code word, and calculates a bit-wise XOR between the result and the input code word. The XOR result is provided as input to LDPC decoder 94. After LDPC decoder 94 completes the decoding process, post-processing unit 106 of ancillary circuitry calculates a bit-wise XOR between the decoder output and the encoded data part of the input code word.

Figure 5:
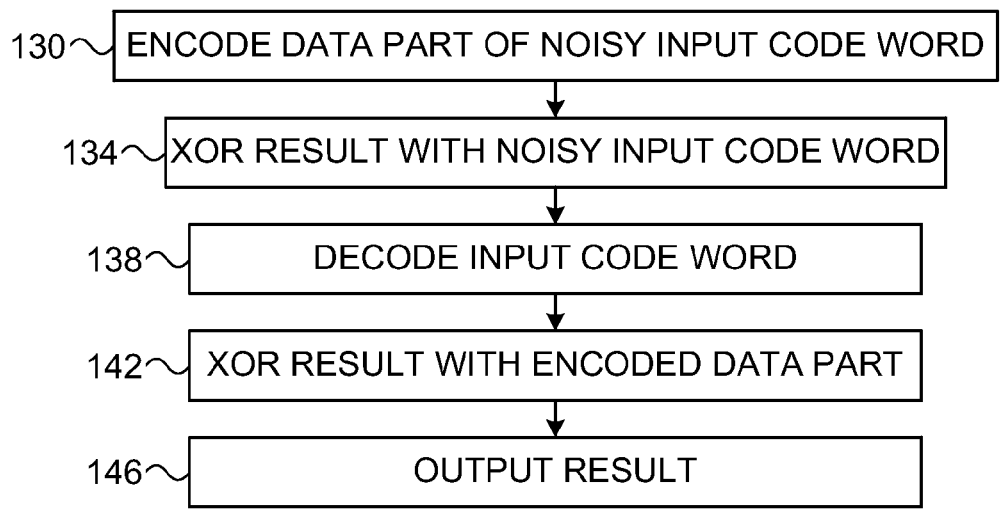

FIG. 5 is a flow chart that schematically illustrates a method for power-optimized ECC decoding, in accordance with an alternative embodiment of the present invention. The method begins with pre-processing unit 102 of ancillary circuitry 98 encoding the data part of the input code word, at a pre-encoding step 130. Unit 102 then calculates a bit-wise XOR between the encoded data part and the noisy input code-word, at a pre-XOR step 134.

At this stage, the data bits of the code word will all become "0". Some of the redundancy bits may be non-zero, but their number is small relative to the total number of bits in the code word. Unit 102 typically keeps the bit reliability unchanged. The XOR result is provided as input to LDPC decoder 94. With this sort of pre-processing, most of the transitions in the LDPC decode will be between LLRs having the same sign.

LDPC decoder 94 decodes the pre-processed input code word, at an LDPC decoding step 138. After the LDPC decoder has converged, post-processing unit 106 calculates a bit-wise XOR between the output of LDPC decoder 94 and the encoded data part of the input code word, at a post-XOR step 142. The XOR result is provided as output, at a result output step 146.

Using the same rationale as the method of FIG. 4 above, it can be shown that the decoding process of FIG. 5 is equivalent to the original decoding process in terms of decoding performance. Thus, the power-efficient scheme of FIG. 5 does not considerably degrade the decoding performance of the LDPC decoder.

In comparison with the scheme of FIG. 4, the scheme of FIG. 5 can be implemented without any modification to LDPC decoder 94. On the other hand, the scheme of FIG. 5 may have a slightly higher number of bit transitions, and some small residual performance degradation due to the additional encoding stage.

Decoding by Representing LLRS Using Sign-Magnitude Format

In some embodiments, at least part of the circuitry of LDPC decoder 94 is configured to process soft decoding metrics (in the present example LLRs) that are represented using a sign-magnitude format. In this format, each LLR is represented by a sign bit and one or more bits indicating the LLR magnitude (as opposed to two's-complement format).

In various embodiments, various portions of the LDPC decoder circuitry, e.g., storage of LLRs in memory and/or data path processing, can be implemented using sign-magnitude format. In many practical cases, at a given stage of the decoding process most of the LLRs will have similar magnitudes.

Therefore, the sign-magnitude format will represent most of the LLRs using the same bit values, with the exception of the sign bit (corresponding to the hard bit value) and some small fluctuations in magnitude (corresponding to the bit reliability measure). Consequently, sign-magnitude format considerably reduces the number of bit transitions in the LDPC decoder in comparison with two's-complement format.

In some embodiments, pre-processing unit 102 accepts the LLRs of the input code word in two's-complement format, and converts the LLRs to sign-magnitude format before providing them to LDPC decoder 94 for decoding.

Figure 6:
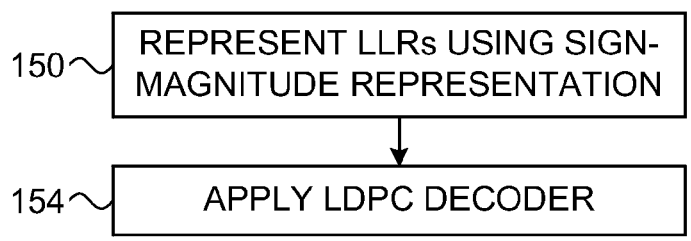

FIG. 6 is a flow chart that schematically illustrates a method for power-optimized ECC decoding, in accordance with another embodiment of the present invention. The method begins with ancillary circuitry 98 representing the input code word (typically a sequence of LLRs) using sign-magnitude format, at a formatting step 150. LDPC decoder 94 then applies a soft LDPC decoding process to the LLRs having the sign-magnitude format, at a sign-magnitude decoding step 154.

CRC Validation Considerations

In some embodiments, the input code word is provided with a set of Cyclic Redundancy Check (CRC) bits for validating the decoded data. The LDPC decoder may use the CRC after decoding to validate the data, or during decoding in order to terminate the decoding process upon converging to valid data. In some embodiments, the CRC is defined as the redundancy bits of an underlying systematic linear code, such as BCH.

When using the pre-processing/post-processing techniques described herein, however, the data bits at the LDPC decoder output at the end of the decoding process are not the original data bits of the input code word, but the original data bits after bit-wise XOR with a fixed bit pattern. Thus, the CRC cannot be validated directly on the LDPC decoder output. It is possible in principle to calculate bit-wise XOR between the LDPC decoder output and the fixed bit pattern in order to enable CRC validation, but this process may sometimes be complex.

In some embodiments, decoder 90 validates the CRC in a more efficient manner. When the CRC is based on an underlying linear code, a conventional LDPC decoder would typically validate the CRC by computing the syndrome of the underlying linear code and comparing to zero.

In some embodiments, ancillary circuitry 98 calculates the syndrome of the underlying linear code over the fixed bit pattern prior to decoding. This syndrome is denoted $S_0$. LDPC decoder 94 may validate the CRC during the decoding process by computing the syndrome of the underlying linear code over the data bits at a certain stage of the decoding process, and comparing the result to the pre-calculated $S_0$.

Alternatively, ancillary circuitry 98 may modify the fixed bit pattern slightly (e.g., by adding more LLRs with a negative sign), such that the CRC will still be zero even after bit-wise XOR between the data and the fixed bit pattern.

The disclosed CRC validation techniques can be generalized in a straightforward manner to CRCs that are not based on pure linear codes, such as CRC based on affine codes.

Although the embodiments described herein refer to several example techniques for pre-processing and post-processing, ancillary circuitry 98 may apply any other suitable type of pre-processing and/or post-processing in order to reduce the number of bit transitions in decoder 94, and thus reduce the decoder power consumption.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:
1. A method, comprising:
accepting an input code word, which was produced by encoding data with an Error Correction Code (ECC), for decoding by a hardware-implemented ECC decoder;

pre-processing the input code word to produce a pre-processed code word, such that a first number of bit transitions that occur in the hardware-implemented ECC decoder while decoding the pre-processed code word is smaller than a second number of the bit transitions that would occur in the ECC decoder in decoding the input code word;

decoding the pre-processed code word using the ECC decoder; and recovering the data from the decoded pre-processed code word;

wherein pre-processing the input code word comprises replacing the input code word with an all-zeros code word, and wherein decoding the pre-processed code word comprises causing the ECC decoder to converge to an error pattern in the input code word.

2. The method according to claim 1, wherein replacing the input code word with the all-zeros code word comprises retaining reliability values of respective bits of the input code word, and providing the all-zeros code word and the reliability values to the ECC decoder.

3. The method according to claim 1, wherein the ECC is defined by a set of check equations, wherein the ECC decoder includes check nodes that correspond respectively to the check equations and exchange messages with bit nodes that correspond to respective bits of the pre-processed code word, and wherein causing the ECC decoder to converge to the error pattern comprises configuring each check node to generate first messages that increase a reliability or retain a sign of bits participating in a respective check equation if an evaluation of the check equation equals a respective syndrome, and to generate second messages that reduce the reliability or invert the sign of the bits participating in the respective check equation if the evaluation of the check equation differs from the respective syndrome.

4. The method according to claim 1, wherein recovering the data comprises calculating a bit-wise XOR between the decoded pre-processed code word and a hard bit estimate of the input code word.

5. The method according to claim 1, wherein the input code word comprises a data part and a redundancy part, and wherein pre-processing the input code word comprises encoding the data part with the ECC to produce an encoding result, and wherein recovering the data comprises calculating a bit-wise XOR between the encoding result and the decoded pre-processed code word.

6. The method according to claim 1, wherein accepting the input code word comprises accepting multiple soft decoding metrics corresponding to respective bits of the input code word, wherein pre-processing the input code word comprises pre-processing the soft decoding metrics, and wherein decoding the pre-processed code word comprises applying a soft decoding process to the pre-processed soft decoding metrics.

7. The method according to claim 6, wherein pre-processing the input code word comprises representing the soft decoding metrics using a sign-magnitude format.

8. The method according to claim 1, and comprising accepting, in addition to the input code word, Cyclic Redundancy Check (CRC) bits that are computed for the input code word, and validating the recovered data using the CRC bits.

9. The method according to claim 8, wherein recovering the data comprises calculating a bit-wise XOR between the decoded pre-processed code word and a fixed data pattern, and wherein validating the data comprises:

computing, over the fixed data pattern, a first syndrome of a linear code used for producing the CRC bits;

computing a second syndrome of the linear code over the recovered data; and comparing the second syndrome to the first syndrome.

10. The method according to claim 8, wherein recovering the data comprises calculating a bit-wise XOR between the decoded pre-processed code word and a fixed data pattern, and wherein validating the data comprises modifying the fixed data pattern such that applying the CRC over the recovered data will be zero when the data is decoded correctly.

11. The method according to claim 1, wherein accepting the input code word comprises receiving the input code word over a communication channel.

12. The method according to claim 1, wherein accepting the input code word comprises reading the input code word from a memory.

13. An apparatus, comprising:

a hardware-implemented Error Correction Code (ECC) decoder, which is configured to decode ECC code words; and ancillary circuitry, which is configured to accept an input code word, which was produced by encoding data with the ECC, to pre-process the input code word to produce a pre-processed code word, such that a first number of bit transitions that occur in the hardware-implemented ECC decoder while decoding the pre-processed code word is smaller than a second number of the bit transitions that would occur in the ECC decoder in decoding the input code word, to decode the pre-processed code word using the ECC decoder, and to recover the data from the decoded pre-processed code word;

wherein the ancillary circuitry is configured to replace the input code word with an all-zeros code word, to provide the all-zeros code word as input to the ECC decoder, and to cause the ECC decoder to converge to an error pattern in the input code word.

14. The apparatus according to claim 13, wherein the ancillary circuitry is configured to retain reliability values of respective bits of the input code word, and to provide the all-zeros code word and the reliability values to the ECC decoder.

15. The apparatus according to claim 13, wherein the ECC is defined by a set of check equations, wherein the ECC decoder comprises check nodes that correspond respectively to the check equations and exchange messages with bit nodes that correspond to respective bits of the pre-processed code word, and wherein the ancillary circuitry is configured to cause the ECC decoder to converge to the error pattern by configuring each check node to generate first messages that increase a reliability or retain a sign of bits participating in a respective check equation if an evaluation of the check equation equals a respective syndrome, and to generate second messages that reduce the reliability or invert the sign of the bits participating in the respective check equation if the evaluation of the check equation differs from the respective syndrome.

16. The apparatus according to claim 13, wherein the ancillary circuitry is configured to recover the data by calculating a bit-wise XOR between the decoded pre-processed code word and a hard bit estimate of the input code word.

17. The apparatus according to claim 13, wherein the input code word comprises a data part and a redundancy part, and wherein the ancillary circuitry is configured to pre-process the input code word by encoding the data part with the ECC to produce an encoding result, and to recover the data by calculating a bit-wise XOR between the encoding result and the decoded pre-processed code word.

18. The apparatus according to claim 13, wherein the ancillary circuitry is configured to accept the input code word by accepting multiple soft decoding metrics corresponding to respective bits of the input code word, to pre-process the soft decoding metrics, and wherein the ECC decoder is configured to apply a soft decoding process to the pre-processed soft decoding metrics.

19. The apparatus according to claim 18, wherein the ancillary circuitry is configured to pre-process the input code word by representing the soft decoding metrics using a sign-magnitude format, and wherein the ECC decoder is configured to decode the input code word in the sign-magnitude format.

20. The apparatus according to claim 13, wherein the ancillary circuitry is configured to accept, in addition to the input code word, Cyclic Redundancy Check (CRC) bits that are computed for the input code word, and to validate the recovered data using the CRC bits.

21. The apparatus according to claim 20, wherein the ancillary circuitry is configured to recover the data by calculating a bit-wise XOR between the decoded pre-processed code word and a fixed data pattern, and to validate the data by:

computing, over the fixed data pattern, a first syndrome of a linear code used for producing the CRC bits;
computing a second syndrome of the linear code over the recovered data; and
comparing the second syndrome to the first syndrome.

22. The apparatus according to claim 20, wherein the ancillary circuitry is configured to recover the data by calculating a bit-wise XOR between the decoded pre-processed code word and a fixed data pattern, and to validate the data by modifying the fixed data pattern such that applying the CRC over the recovered data will be zero when the data is decoded correctly.

23. The apparatus according to claim 13, further comprising a receiver that is configured to receive the input code word over a communication channel and to provide the input code word to the ancillary circuitry.

24. The apparatus according to claim 13, further comprising read/write circuitry that is configured to read the input code word from a memory and to provide the input code word to the ancillary circuitry.

* * * * *